(12) United States Patent
Song et al.

(10) Patent No.: US 9,122,114 B2
(45) Date of Patent: Sep. 1, 2015

(54) ARRAY SUBSTRATE AND MANUFACTURING METHOD THEREOF

(75) Inventors: Youngsuk Song, Beijing (CN); Seungjin Choi, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 453 days.

(21) Appl. No.: 13/475,622

(22) Filed: May 18, 2012

(65) Prior Publication Data

US 2012/0292625 A1 Nov. 22, 2012

(30) Foreign Application Priority Data

May 20, 2011 (CN) .......................... 2011 1 0132769

(51) Int. Cl.
*H01L 21/00* (2006.01)
*G02F 1/1362* (2006.01)
(Continued)

(52) U.S. Cl.
CPC ........ *G02F 1/1362* (2013.01); *G02F 1/134363* (2013.01); *H01L 27/1288* (2013.01); *G02F 1/1368* (2013.01); *G02F 1/133555* (2013.01);
(Continued)

(58) Field of Classification Search
CPC ............... G02F 1/133555; G02F 1/134363; G02F 1/1362; G02F 1/136227; G02F 1/1368; G02F 2001/134372; G02F 2001/136231; G02F 2001/136236; G02F 2201/48; H01L 27/1288
USPC ............ 257/40, 59, 69, 72, E27.001, E27.13, 257/E27.132, E51.001; 438/34, 82, 99; 349/38, 39, 42, 43, 46, 47, 56, 122, 349/138, 142, FOR. 111; 345/695, 923
See application file for complete search history.

(56) References Cited

U.S. PATENT DOCUMENTS

2006/0279677 A1 12/2006 Matsushima
2007/0051958 A1 3/2007 Yamazaki et al.
(Continued)

FOREIGN PATENT DOCUMENTS

CN 1871711 A 11/2006
CN 101211072 A 7/2008
(Continued)

OTHER PUBLICATIONS

First ChineseOffice Action dated Aug. 28, 2013 Appln. No. 201110132769.5.
(Continued)

*Primary Examiner* — Meiya Li
(74) *Attorney, Agent, or Firm* — Ladas & Parry LLP

(57) ABSTRACT

An embodiment of the disclosed technology provides a method of manufacturing an array substrate, including: a first mask process of forming an inorganic material protrusion on a base substrate; a second mask process of forming a reflective region pattern, a gate line, a gate electrode branched from the gate line, and a common electrode; a third mask process of forming an active island and a data line formed and forming a source electrode connected to the data line and a drain electrode on the active island and a channel; a fourth mask process of forming an insulation material layer, treating the insulation material layer to form a planarization layer, and forming a through hole above the drain electrode; and a fifth mask process of forming a pixel electrode and connected to the drain electrode via the through hole in a reflective region.

16 Claims, 4 Drawing Sheets

(51) Int. Cl.
  *H01L 27/12* (2006.01)
  *G02F 1/1335* (2006.01)
  *G02F 1/1368* (2006.01)
  *G02F 1/1343* (2006.01)

(52) U.S. Cl.
  CPC ............ *G02F 1/136227* (2013.01); *G02F 2001/134372* (2013.01); *G02F 2001/136231* (2013.01); *G02F 2001/136236* (2013.01); *G02F 2201/48* (2013.01)

(56) References Cited

U.S. PATENT DOCUMENTS

| | | |
|---|---|---|
| 2007/0109455 A1 | 5/2007 | Kim et al. |
| 2008/0151156 A1 | 6/2008 | Ino |
| 2008/0180624 A1 | 7/2008 | Choi et al. |
| 2010/0053517 A1 | 3/2010 | Imai et al. |

FOREIGN PATENT DOCUMENTS

| | | |
|---|---|---|
| KR | 20070050612 A | 5/2007 |
| KR | 100816145 B1 | 3/2008 |
| KR | 20110012111 A | 2/2011 |
| WO | 2008/129748 A1 | 10/2008 |
| WO | 2008129748 a1 | 10/2008 |

OTHER PUBLICATIONS

Korean Office Action dated Aug. 28, 2013 Appln. No. KR1020120053097.
Extended European Search Report dated Mar. 9, 2012; Appln. 12168555.6-2205.
Korean Office Action dated Aug. 21, 2013; Appln. 10-2012-0053097.
Korean Notice of Allowance issued Jan. 20, 2014; Appln. 10-2012-0053097.
European Patent Application Appln. No. 12 168 555.6-1904; Dated Mar. 9, 2015.

ARRAY SUBSTRATE AND MANUFACTURING METHOD THEREOF

BACKGROUND

Embodiments of the disclosed technology relate to an array substrate and a method of manufacturing the array substrate.

According to the direction of the electric field for driving liquid crystal molecules, liquid crystal displays (LCDs) can be classified into vertical electric field type liquid crystal displays and horizontal electric field type liquid crystal displays. An example of horizontal electric field type liquid crystal displays is an Advanced-Super Dimensional Switching (AD-SDS) horizontal electric field type liquid crystal display.

With respect to an AD-SDS LCD, a parallel electric field generated by edges of pixel electrodes in a same plane and a vertical electric field generated between the layer of pixel electrodes and a layer of a common electrode constitute a multi-dimension electric field, and the liquid crystal molecules in all orientations between the pixel electrodes and directly above the electrodes inside a liquid crystal panel can be rotated, thus the work efficiency of the liquid crystal molecules can be improved and a light-transmitting efficiency can be increased. The AD-SDS technology can improve the display quality of a TFT-LCD, and has advantages of high transmittance, wide viewing angle, high aperture ratio, low chromatic aberration, short response time, no push mura, etc.

Most of the conventional AD-SDS display devices are manufactured by a conventional staggered back channel etching method, and the staggered back channel etching method employs a six-mask process. A mask process takes a relatively long time period and the costs thereof are relatively high in a manufacturing process of a TFT-LCD panel, so compared with an in-plane switch (IPS) mode display or a vertical alignment mode display manufactured by using a five-mask process, a manufacturing method of the conventional AD-SDS display device has a disadvantage of relatively low manufacturing efficiency.

SUMMARY

In order to overcome the drawbacks in the conventional manufacturing method, one or more embodiments of the disclosed technology provide a method of manufacturing an array substrate, an array substrate, and a liquid crystal display.

An embodiment of the disclosed technology provides a method of manufacturing an array substrate, comprising: a first mask process of forming an inorganic material protrusion on a base substrate; a second mask process of forming a reflective region pattern, a gate line, a gate electrode branched from the gate line, and a common electrode respectively from a first metal layer and a first transparent conductive layer on the base substrate obtained from the first mask process; a third mask process of forming an active island formed of a semiconductor layer and a data line formed of a second metal layer on the base substrate obtained from the second mask process and forming a source electrode connected to the data line and a drain electrode on the active island and a channel from the semiconductor layer; a fourth mask process of forming an insulation material layer on the base substrate obtained from the third mask process, treating the insulation material layer to form a planarization layer, and forming a through hole in the insulation material layer above the drain electrode; and a fifth mask process of forming a pixel electrode from a second transparent conductive layer and connected to the drain electrode via the through hole in a reflective region.

An embodiment of the disclosed technology provides an array substrate, comprising: a base substrate; an inorganic material protrusion, disposed on the base substrate; a reflective region pattern, a gate line and a gate electrode and a common electrode branched from the gate line, formed respectively of a first transparent conductive layer and a first metal layer on the base substrate; an active island formed of a semiconductor layer and a data line formed of a second metal layer on the base substrate; a source electrode and a drain electrode, connected to the data line on the active island; a channel, formed of the semiconductor layer; a planarization layer deposited on the base substrate and formed of an inorganic material, wherein the planarization layer comprises a through hole connected to the drain electrode; and a pixel electrode, disposed on the base substrate, formed of a second transparent conductive layer and connected to the drain electrode via the through hole.

Further another embodiment of the disclosed technology provides a liquid crystal display comprising an above-described array substrate.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF ACCOMPANYING DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

The embodiments of the disclosed technology being thus described below, it will be obvious that the disclosed embodiments may be varied in many ways. Such variations should not be regarded as a departure from the spirit and scope of the disclosed technology, and all such modifications as would be obvious to those skilled in the art are intended to be included within the scope of the accompanying claims.

The technical problem intended to be solved and advantages of the embodiments of the disclosed technology will become apparent from a following detailed description.

Figure 1:
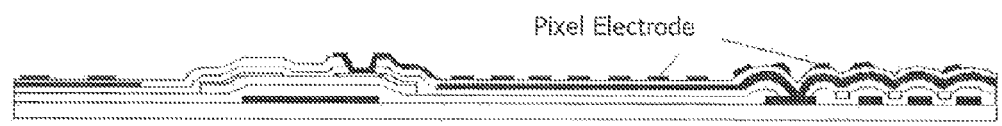
FIG. 1 is a structural schematic view of a conventional AD-SDS display device.

A conventional AD-SDS display device can be manufactured by using a six-mask process, and a structure of the obtained array substrate is shown in FIG. 1, in which a pixel electrode disposed above a reflective portion of a pixel does not have a flat and co-planar surface, so that the conventional AD-SDS display device is disadvantageous in driving liquid crystal molecules.

An embodiment of the disclosed technology provides a method of manufacturing an array substrate of an AD-SDS display, the number of mask processes used in the method can be decreased, a manufacturing time period can be reduced, and therefore the production efficiency can be improved and manufacturing costs can be reduced. In an embodiment of the disclosed technology, a planarization layer may be further provided above the reflection region of a pixel, so a pixel electrode can be formed co-planarly on a base substrate and the liquid crystal panel can normally and horizontally perform switching in AD-SDS driving. The method uses a five-mask process, for example.

A method of manufacturing an AD-SDS array substrate is provided in an embodiment of the disclosed technology, the method comprising the following steps.

In a first mask process, a protrusion formed with an inorganic material is provided on a base substrate. A mask process (patterning process) typically includes forming thin film, applying photoresist, photoresist exposing and developing, etching thin film by using a photoresist pattern, removing remaining photoresist, etc.

In a second mask process, a reflective region pattern, a gate line, a gate electrode branched from the gate line, and a common electrode are respectively formed from a first metal layer and a first transparent conductive layer on the base substrate from the first mask process.

In a third mask process, an active island formed from a semiconductor layer and a data line formed from a second metal layer are provided on the base substrate from the second mask process, a source electrode connected to the data line and a drain electrode are formed on the active island, and a channel of a thin film transistor (TFT) is formed with the semiconductor layer.

The active island refers to an island-shape pattern functioning as an active layer and used to form a TFT, and is generally formed between a gate electrode and the source and drain electrodes.

In a fourth mask process, an inorganic material layer is for example coated on the base substrate from the third mask process, a tempering or annealing process is performed on the inorganic material to form a planarization layer, and a through hole is formed above the drain electrode in the inorganic material layer.

In a fifth mask process, a pixel electrode connected to the drain electrode via the through hole in a reflective region is formed, and the pixel electrode is formed with a second transparent conductive layer.

The method of manufacturing the AD-SDS array substrate according to the embodiment of the disclosed technology can use a five-mask process to manufacture the array substrate of an AD-SDS display device. The number of mask processes used in the method can be decreased, so a manufacturing time period and manufacturing costs can be reduced. In addition, a planarization layer can be further provided above a reflection region of a pixel, so a pixel electrode can be formed co-planarly on a base substrate and a liquid crystal panel can normally and horizontally perform switching in AD-SDS driving.

Figure 2:
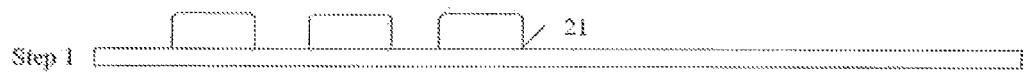
FIGS. 2-12 are process schematic views of manufacturing an array substrate of an AD-SDS display according to an embodiment of the disclosed technology.

Hereinafter, a detailed description for the examples of the method of manufacturing the AD-SDS array substrate according to the embodiment of the disclosed technology are explained in conjunction with FIG. 2.

As shown in FIGS. 2-12, the detailed description for manufacturing the AD-SDS array substrate comprising the following steps.

Step 1: forming protrusions 21 by using an inorganic material on a base substrate. For example, the inorganic material may be an inorganic resin containing $SiO_2$, SiNx, or the like, as shown in FIG. 2.

Figure 3:

Step 2: treating for example by tempering (or reflowing) the protrusions 21 to form into a larger protrusion 21' with corners of about 6~10 degree, so that the protrusion becomes flatter, as shown in FIG. 3. For example, the temperature of the tempering may be 200-250 centigrade (° C.) and the time period may be 20~60 min.

Figure 4:

Step 3: sequentially depositing a first transparent conductive layer 22 and a first metal layer 23 on the base substrate from the steps 1 and 2, as shown in FIG. 4.

The first metal layer may be formed of a metal having a good conductive property, such as Mo, Al, Ti or Cu, for manufacturing a gate line and a gate electrode. The first transparent conductive layer may be an indium zinc oxide (IZO) layer, an indium tin oxide (ITO) layer or the like.

Figure 5:

Step 4: applying a layer of photoresist 24 on the base substrate from the above steps, and then exposing and developing the photoresist 24 to obtain a photoresist pattern, as shown in FIG. 5.

In one example, a half-tone mask or a gray mask may be used in the exposing and developing process, and thus, after a photoresist layer is exposed by using such a mask and developed, a concavo-convex photoresist layer with two regions having different thicknesses can be formed. The region where the thickness of the photoresist layer is bigger corresponds to a reflective region of a pixel, and the region where the thickness of the photoresist layer is smaller corresponds to a transmissive region of the pixel. An exposure light source used in this example may be any suitable exposure light source, preferably, an ultraviolet light source.

Figure 6:

Step 5: performing an etching process by using the resultant photoresist pattern as an etching mask after the exposing and developing process. The first transparent conductive layer and the first metal layer in the region where the photoresist pattern is not formed are removed, as shown in FIG. 6.

In the embodiment, the etching process may be a dry etching process or a wet etching process, and preferably, a dry etching process.

Figure 7:

Step 6: ashing the photoresist pattern, as shown in FIG. 7.

In this step, the photoresist layer can be thinned on the base substrate, the photoresist in the region where the thickness of the photoresist layer is smaller can be removed and the photoresist in the region where the thickness of the photoresist layer is bigger is partly removed and reduced in thickness.

Figure 8:

Step 7: performing another etching process after the ashing process to form a reflective region pattern, a gate line, a gate electrode branched from the gate line, and a common electrode respectively from the first metal layer and the first transparent conductive layer. In this etching process, the first metal layer being not covered by the photoresist pattern after the ashing process is removed, as shown in FIG. 8.

Figure 9:
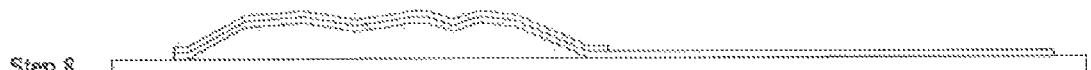

Step 8: removing the residual photoresist from the base substrate, as shown in FIG. 9.

Step 9: sequentially depositing an insulation layer 25, a semiconductor layer and a second metal layer on the base substrate from the above-described steps.

The insulation layer 25 may be a SiON layer or a SiN layer for example. The semiconductor layer may be an amorphous silicon (a-Si) layer, poly-silicon layer, or oxide semiconductor such as ZnOx, for example. The second metal layer may be formed of a metal having a good conductive property, such as Mo, Al, Ti or Cu for manufacturing source and drain electrodes.

Step 10: coating a layer of photoresist on the second metal layer and performing exposing and developing processes.

In one example, a half tone mask or a gray mask may be similarly used in the exposing and developing processes to form a concavo-convex photoresist layer with two regions having different thicknesses. The thickness of the photoresist layer corresponding to a channel region of a TFT is smaller than that of the photoresist layer corresponding to the source and drain electrodes of the TFT and a data line. The photoresist layer in the rest region is removed. In this step, the exposure light source may be any suitable exposure light source, preferably, an ultraviolet light source.

Step 11: performing an etching process by using the obtained photoresist pattern as an etching mask after the exposing and developing processes to form an active island from the semiconductor layer and a data line from the second metal layer. The semiconductor layer and the second metal layer not covered by the photoresist pattern are removed.

Step 12: ashing the photoresist, wherein the photoresist with a relatively smaller thickness is removed and the photoresist with a relatively larger thickness is partially remained with a reduced thickness.

Steps 13-14: performing another etching process by using the photoresist pattern after the ashing process and forming a source electrode 26 connected to the data line for example and a drain electrode 27 on the active island and a channel 28 from the semiconductor layer.

In the step, the second metal layer exposed by the photoresist pattern obtained after the ashing process is removed, and the thus-exposed semiconductor layer is for example partly etched to define the channel 28 in the semiconductor layer. Here the reflective region of the common electrode is formed of the first transparent conductive layer and the first metal layer, and the transmissive region of the common electrode is formed of the first transparent conductive layer.

Figure 10:
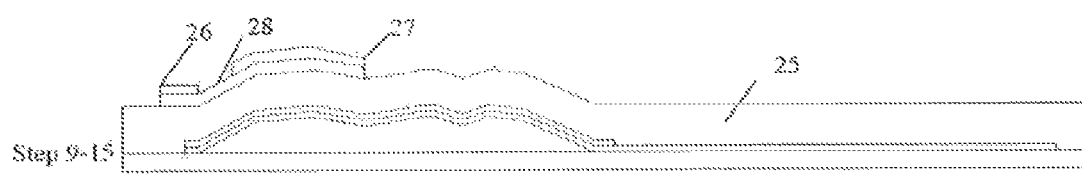

Step 15: removing the residual photoresist. The structure obtained after the steps 9-15 is shown in FIG. 10.

Figure 14:
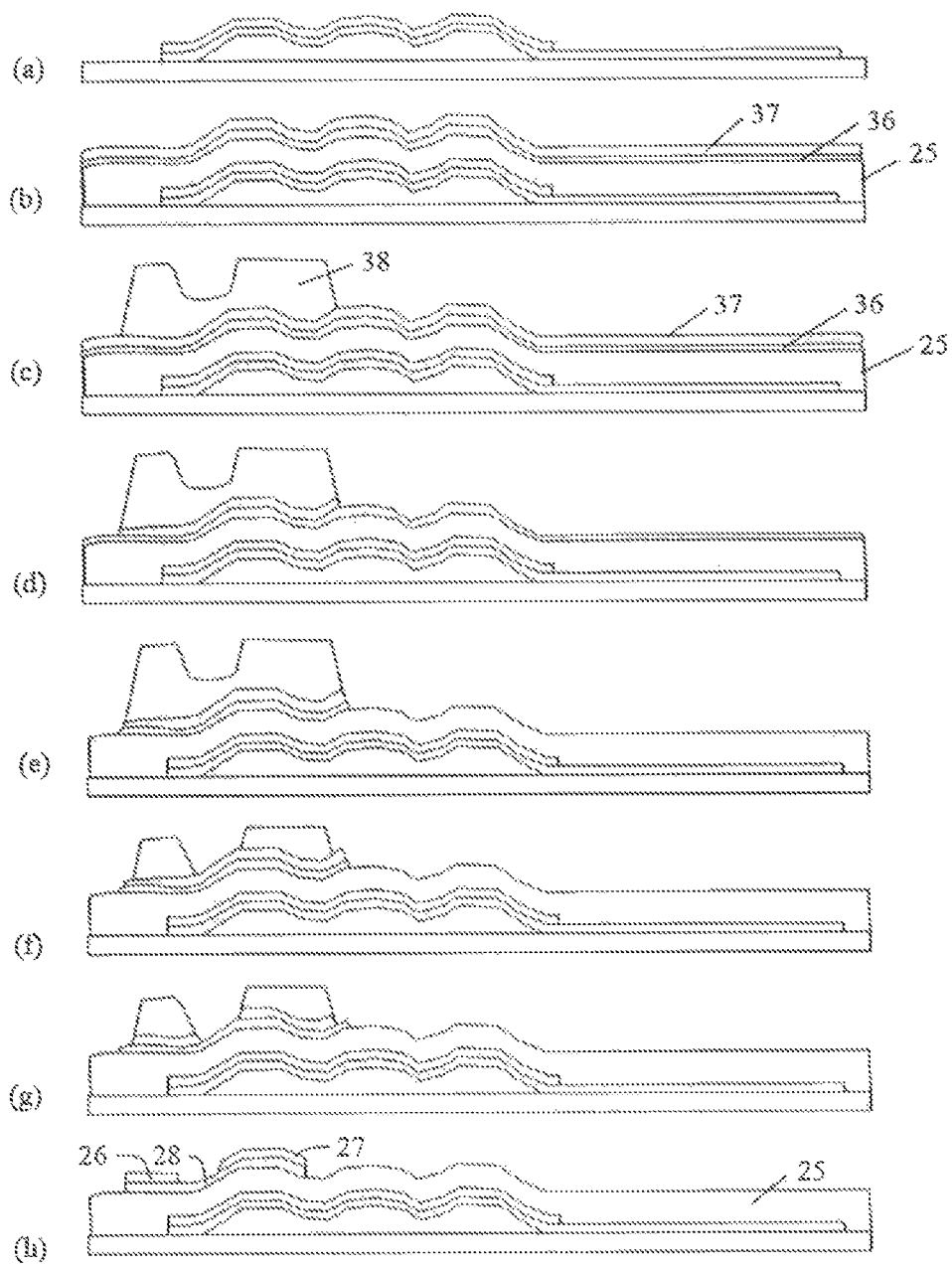
FIG. 14(*a*)-(*h*) are process schematic views of an example of steps 8-15.

FIGS. 14(a)-(h) are process schematic views showing an example of steps 8-15. Specifically, FIG. 14(a) is a schematic view after step 8; FIG. 14(b) is a schematic view after step 9, in which an insulation layer 25, a semiconductor layer 36 and a second metal layer 37 are sequentially deposited on the base substrate; FIG. 14(c) is a schematic view after step 10, in which a concavo-convex photoresist layer 38 with two regions having different thicknesses is formed at the position for forming a thin film transistor and a data line; FIG. 14(d) is a schematic view showing step 11, in which the semiconductor layer 36 is etched by using the photoresist layer 38 as an etching mask; FIG. 14(e) is a schematic view after step 11, in which the second metal layer 37 is further etched by using the photoresist layer 38 as an etching mask; FIG. 14(f) is a schematic view after step 12, in which the concavo-convex photoresist layer 38 is subject to an ashing process and the photoresist is removed from the channel region; FIG. 14(g) is a schematic view after steps 13-14, in which the semiconductor layer 36 and the second metal layer 37 at the channel region are removed so as to define the channel, the source electrode, and the drain electrode of the thin film transistor and the data line; and FIG. 14(h) is a schematic view after step 15, in which the remaining photoresist layer 38 are finally removed from the base substrate.

Step 16: forming for example by coating an insulation material layer on the base substrate from the above steps.

The insulation material layer may comprise an inorganic material, such as an inorganic resin containing silicon dioxide or silicon nitride.

Figure 11:
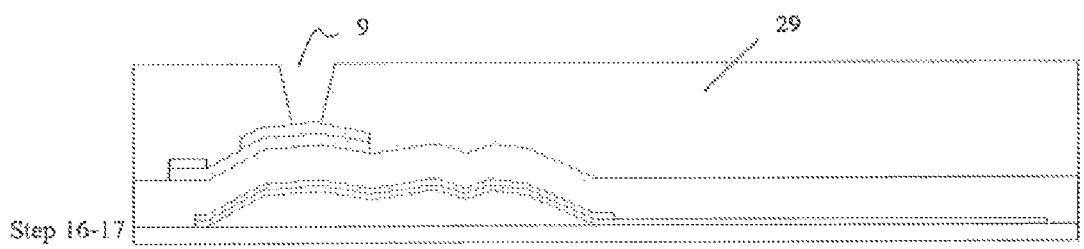

Step 17: treating for example by tempering (or reflowing) the insulation material to form a planarization layer 29, coating a layer of photoresist on the base substrate on which the above structures have been formed and exposing and developing the photoresist to form a photoresist pattern, and then performing an etching process by using the photoresist pattern to form a through hole 9 above the drain electrode in the planarization layer, and then removing the photoresist. The structures obtained in the steps 16-17 are shown in FIG. 11.

In this step, for example the temperature of the tempering may be 200-250 centigrade (° C.) and the time period may be 20~60 min; a planarization rate of the planarization layer is for example more than 95% after the tempering.

Step 18: depositing a second transparent conductive layer on the base substrate on which the above structures have been formed.

The second transparent conductive layer may be an IZO layer or an ITO layer, for example.

Step 19: coating a layer of photoresist on the second transparent conductive layer and exposing and developing the photoresist to form a photoresist pattern.

Step 20: etching the second transparent conductive layer by using the photoresist pattern as an etching mask and then forming a pixel electrode 30 connected to the drain electrode 27 via the through hole in the reflective region of the pixel.

Figure 12:
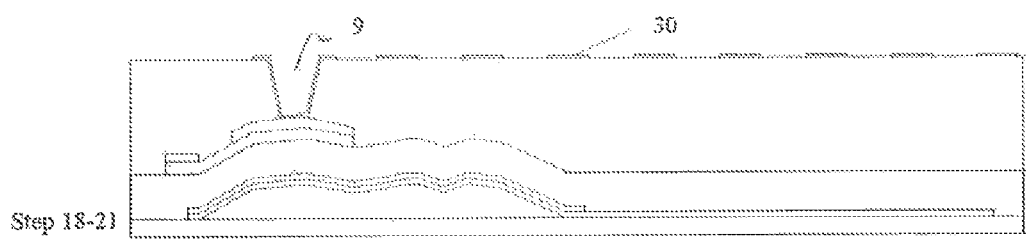

Step 21: removing the residual photoresist. The structure obtained after the steps 18-21 is shown in FIG. 12.

Figure 13:
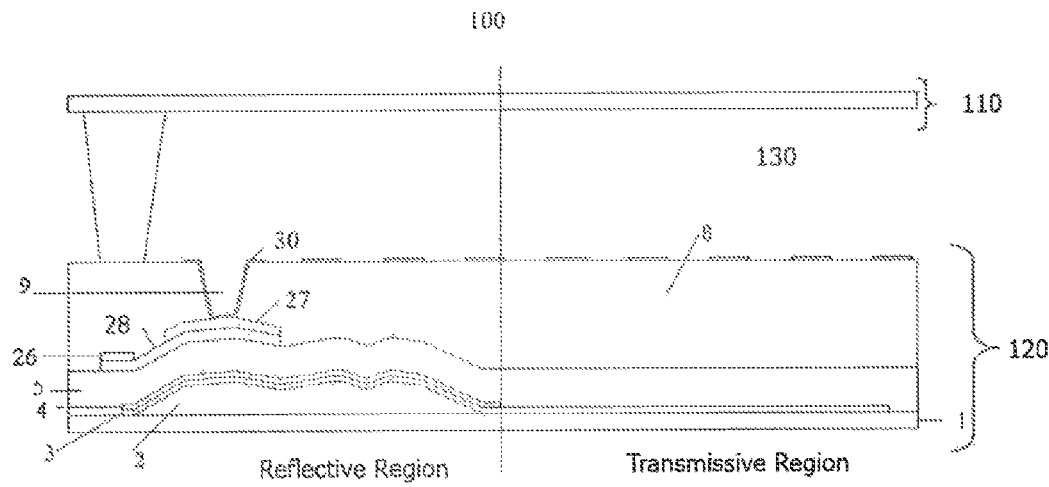
FIG. 13 is a structural schematic view of the array substrate of the AD-SDS display according to an embodiment of the disclosed technology.

FIG. 13 is a structural schematic view of the AD-SDS array substrate manufactured by the above processes according to an embodiment of the disclosed technology.

As show in FIG. 13, the AD-SDS array substrate 120 according to the embodiment comprising:

a base substrate 1 such as a glass substrate or a plastic substrate;

an inorganic material protrusion 2 formed on the base substrate 1;

a reflective region pattern, a gate line, a gate electrode 4 branched from the gate line, and a common electrode 3 for example formed respectively of a first metal layer and a first transparent conductive layer on the base substrate;

an active island 5 formed of a semiconductor layer and a data line, a source electrode 26 connected to the data line, and a drain electrode 27 formed of a second metal layer on the active island on the base substrate, and a channel 28 defined in the semiconductor layer; and a planarization layer 8 provided on the base substrate and formed of an insulation material.

The planarization layer 8 comprises a through hole 9 connected to the drain electrode 27; and a pixel electrode 30 disposed on the base substrate for example formed of a second transparent conductive layer and connected to the drain electrode 27 via the through hole 9.

In an embodiment of the disclosed technology, the array substrate of the AD-SDS display device can be manufactured by a five-mask process, so the number of the employed mask processes can be decreased, a manufacturing time period can be reduced, and therefore manufacturing costs can be reduced. In addition, as shown in FIG. 13, a planarization layer 8 for example formed of an inorganic resin is formed above a reflection region of a pixel on the array substrate of the AD-SDS display device, so that a pixel electrode can be formed coplanarly on the base substrate and the liquid crystal panel can normally and horizontally perform switching in AD-SDS driving.

As shown in FIG. 13, an embodiment of the disclosed technology further provides an AD-SDS type liquid crystal display 100, comprising: a color filter substrate 110; an array substrate 120; and a liquid crystal layer 130, filled between the color filter substrate 110 and the array substrate 120. A color resin is formed on the color filter substrate 110 to obtain a RGB (Red: Green: Blue) light for display.

Finally, it should be explained that, the above embodiments are only used for explaining the technical solution of the disclosed technology, and not for limitation thereto. Although the disclosed technology has been explained in details with reference to the preferred embodiments, it should be understood by those skilled in the art that modifications and equivalent alternations may be made to the technical solution of the disclosed technology, and these modifications and equivalent alternations can not depart the modified technical solution from the spirit and scope of the technical solution of the disclosed technology.

What is claimed is:

1. A method of manufacturing an array substrate, comprising:
   a first mask process of forming an inorganic material protrusion on a base substrate;
   a second mask process of forming a reflective region pattern, a gate electrode, and a common electrode respectively, from a first metal layer and a first transparent conductive layer, on the base substrate obtained from the first mask process;
   a third mask process of forming an active island formed of a semiconductor layer, on the base substrate obtained from the second mask process, forming a source electrode and a drain electrode, which are formed of a second metal layer, on the active island, and forming a channel from the semiconductor layer;
   a fourth mask process of forming an insulation material layer, on the base substrate obtained from the third mask process; treating the insulation material layer to form a planarization layer, and forming a through hole in the insulation material layer above the drain electrode; and
   a fifth mask process of forming a second transparent conductive layer on the planarization layer, and forming a pixel electrode from the second transparent conductive layer, the pixel electrode being connected to the drain electrode via the through hole in a reflective region.

2. The method of manufacturing the array substrate according to claim 1, wherein during the second mask process, sequentially depositing the first transparent conductive layer and the first metal layer, on the base substrate obtained from the first mask process, and performing the second mask process by using a half tone mask or a gray mask to make the reflective region to be formed of the first transparent conductive layer and the first metal layer and a transmissive region to be formed of the first transparent conductive layer.

3. The method of manufacturing the array substrate according to claim 1, wherein during the third mask process, sequentially depositing an insulation layer, the semiconductor layer and the second metal layer, on the base substrate obtained from the second mask process, and performing the third mask process by using a second half tone mask or a second gray mask.

4. The method of manufacturing the array substrate according to claim 2, wherein during the third mask process, sequentially depositing an insulation layer, the semiconductor layer and the second metal layer, on the base substrate obtained from the second mask process, and performing the third mask process by using a second half tone mask or a second gray mask.

5. The method of manufacturing the array substrate according to claim 1, wherein during the first mask process, forming protrusions by using an inorganic material on the base substrate and treating the protrusions to form into protrusions with corners in 6~10 degrees.

6. The method of manufacturing the array substrate according to claim 5, wherein the treating for the protrusions includes a tempering process, and a temperature of the tempering process is 200-250 centigrade and a time period is 20~60 minutes.

7. The method of manufacturing the array substrate according to claim 2, wherein during the first mask process, forming protrusions by using an inorganic material on the base substrate and treating the protrusions to form into protrusions with corners in 6~10 degrees.

8. The method of manufacturing the array substrate according to claim 7, wherein the treating for the protrusions includes a tempering process, and a temperature of the tempering process is 200-250 centigrade and a time period is 20~60 minutes.

9. The method of manufacturing the array substrate according to claim 3, wherein during the first mask process, forming protrusions by using an inorganic material on the base substrate and treating the protrusions to form into protrusions with corners in 6~10 degrees.

10. The method of manufacturing the array substrate according to claim 9, wherein the treating for the protrusions includes a tempering process, and a temperature of the tempering process is 200-250 centigrade and a time period is 20~60 minutes.

11. The method of manufacturing the array substrate according to claim 1, wherein a planarization rate of the planarization layer is more than 95% after the treating for the planarization layer in the fourth mask process.

12. The method of manufacturing the array substrate according to claim 1, wherein the insulation material layer in the fourth mask process is an inorganic resin containing silicon dioxide or silicon nitride.

13. The method of manufacturing the array substrate according to claim 3, wherein in the third mask process, the insulation layer is a silicon oxynitride silicon layer or a nitride silicon layer.

14. The method of manufacturing the array substrate according to claim 1, wherein the semiconductor layer comprises amorphous silicon, poly-silicon, or oxide semiconductor.

15. The method of manufacturing the array substrate according to claim 1, wherein the second metal layer is formed of Mo, Al, Ti or Cu.

16. The method of manufacturing the array substrate according to claim 1, wherein the first transparent conductive layer and the second transparent conductive layer are an IZO layer or an ITO layer.

* * * * *